(12) United States Patent
Judendorfer et al.

(10) Patent No.: US 12,386,122 B2
(45) Date of Patent: Aug. 12, 2025

(54) OPTICAL WAVEGUIDE FOR A MAGNETO-OPTICAL CURRENT SENSOR

(71) Applicant: HSP Hochspannungsgeräte GmbH, Troisdorf (DE)

(72) Inventors: Thomas Judendorfer, Bayern (DE); Stefan Schuberth, Bavaria (DE)

(73) Assignee: HSP Hochspannungsgeräte GmbH, Troisdorf (DE)

( * ) Notice: Subject to any disclaimer, the term of this patent is extended or adjusted under 35 U.S.C. 154(b) by 164 days.

(21) Appl. No.: 18/020,929

(22) PCT Filed: Aug. 16, 2021

(86) PCT No.: PCT/EP2021/072730
§ 371 (c)(1),
(2) Date: Feb. 11, 2023

(87) PCT Pub. No.: WO2022/043113
PCT Pub. Date: Mar. 3, 2022

(65) Prior Publication Data
US 2023/0288641 A1    Sep. 14, 2023

(30) Foreign Application Priority Data
Aug. 31, 2020 (DE) .................. 10 2020 210 949.4

(51) Int. Cl.
*G01R 33/02* (2006.01)
*G01R 15/24* (2006.01)
(Continued)

(52) U.S. Cl.
CPC .......... *G02B 6/3818* (2013.01); *G01R 15/246* (2013.01); *G01R 33/0322* (2013.01)

(58) Field of Classification Search
CPC .... G02B 6/264; G02B 6/2713; G02B 6/3818; G02B 6/3845; G02B 6/4457; G01R 15/246; G01R 15/247; G01R 33/0322
See application file for complete search history.

(56) References Cited

U.S. PATENT DOCUMENTS 5,391,869 A * 2/1995 Ade .................. H01L 31/105
257/E31.066
5,834,933 A   11/1998 Meier
(Continued)

FOREIGN PATENT DOCUMENTS

DE    2834098 A1    2/1980
DE    4342410 A1    6/1995
(Continued)

OTHER PUBLICATIONS

PCT International Search Report and Written Opinion of International Searching Authority mailed Dec. 2, 2021 corresponding to PCT International Application No. PCT/EP2021/072730 filed Aug. 16, 2021.

*Primary Examiner* — Thang X Le
(74) *Attorney, Agent, or Firm* — David R. Stevens; Stevens Law Group

(57) ABSTRACT

An optical waveguide for a magneto-optical current sensor. The optical waveguide includes a first end surface, through which light can be coupled into the optical waveguide, and a second end surface, through which light can be coupled out of the optical waveguide, wherein at least one of the two end surfaces has an anti-reflective coating.

16 Claims, 2 Drawing Sheets

(51) Int. Cl.
 *G01R 33/032* (2006.01)
 *G02B 6/38* (2006.01)

(56) References Cited

U.S. PATENT DOCUMENTS

| | | | |
|---|---|---|---|
| 6,128,423 | A | 10/2000 | Shirai |
| 6,534,977 | B1 | 3/2003 | Duncan |
| 2006/0103380 | A1* | 5/2006 | Kochergin ......... G01R 33/0322 324/244.1 |
| 2008/0159684 | A1* | 7/2008 | Sanders ............... G01R 15/246 385/12 |
| 2009/0214152 | A1 | 8/2009 | Huang |
| 2010/0309473 | A1 | 12/2010 | Sanders |
| 2012/0121216 | A1* | 5/2012 | Oh ....................... G01R 15/246 385/1 |
| 2016/0169942 | A1* | 6/2016 | Kufner ................ G01R 15/246 324/95 |
| 2021/0088558 | A1* | 3/2021 | Bohnert ............... G01R 15/246 |
| 2023/0016963 | A1* | 1/2023 | Imai .................... G02B 6/0065 |

FOREIGN PATENT DOCUMENTS

| | | | |
|---|---|---|---|
| DE | 10259390 | * | 7/2004 |
| DE | 10259390 | A1 | 7/2004 |
| EP | 1211528 | A2 | 6/2002 |

* cited by examiner

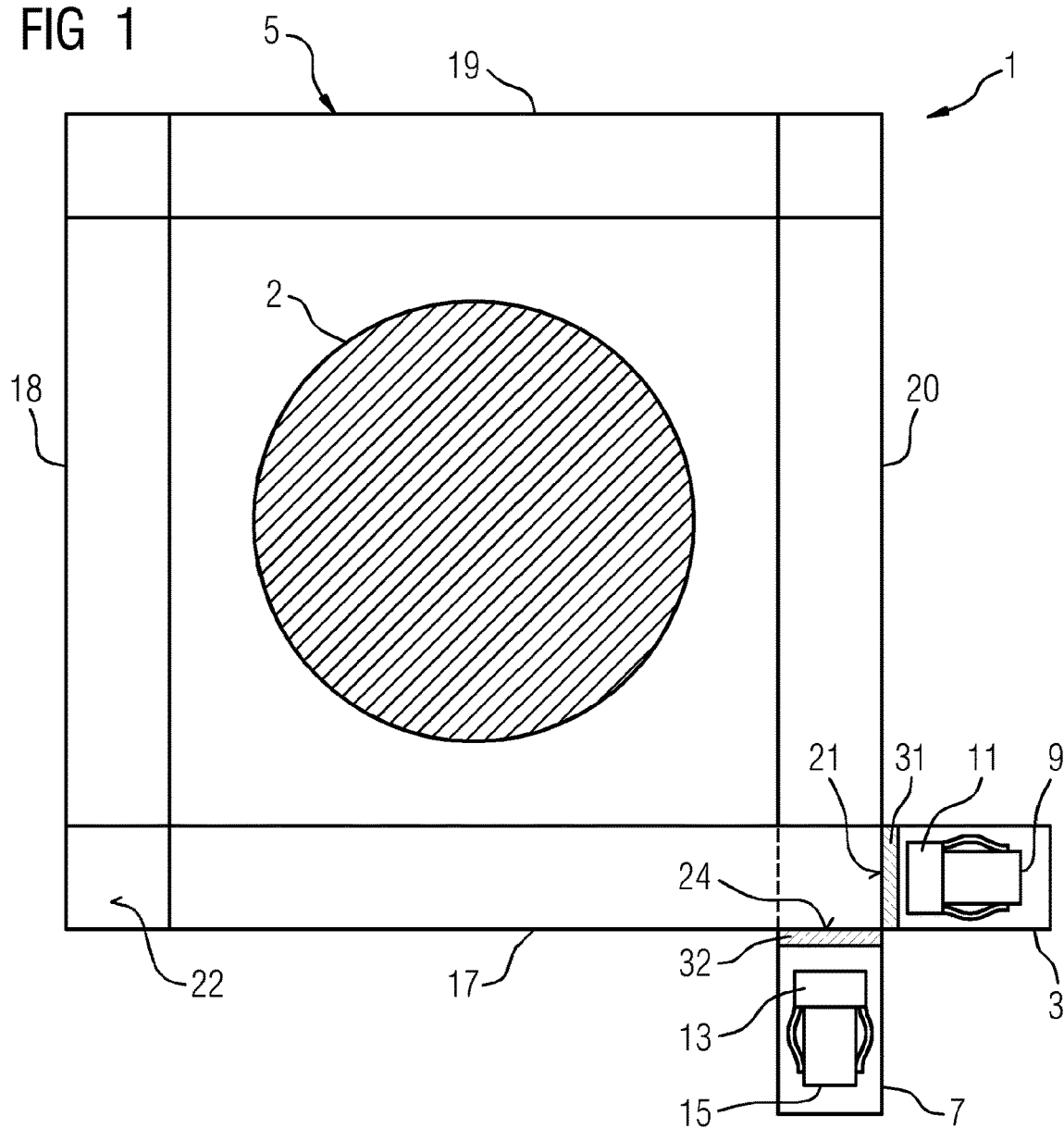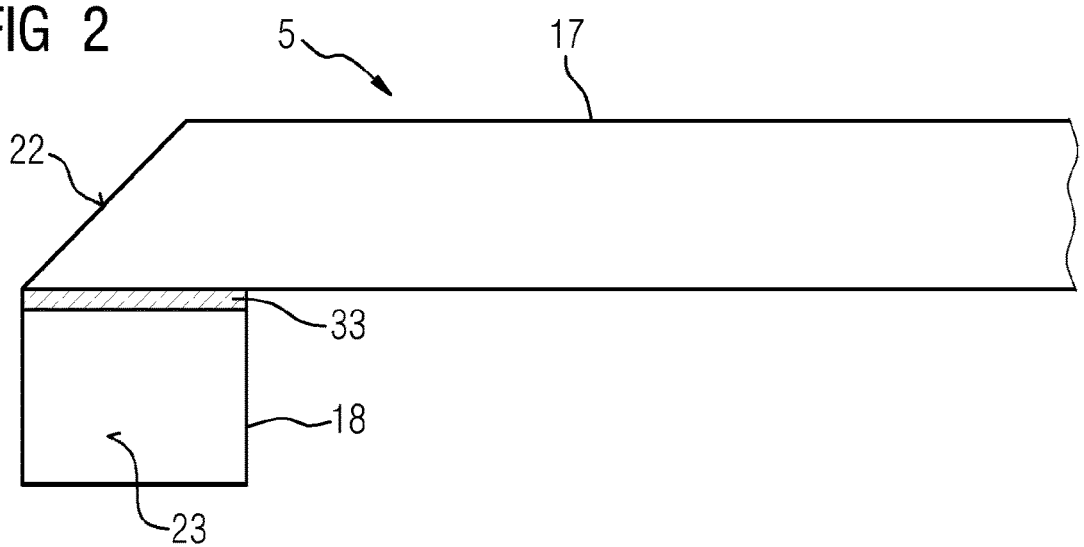

OPTICAL WAVEGUIDE FOR A MAGNETO-OPTICAL CURRENT SENSOR

CROSS REFERENCE TO RELATED APPLICATIONS

This application is the US National Stage of International Application No. PCT/EP2021/072730 filed 16 Aug. 2021, and claims the benefit thereof. The International Application claims the benefit of German Application No. DE 10 2020 210 949.4 filed 31 Aug. 2020. All of the applications are incorporated by reference herein in their entirety.

FIELD OF INVENTION

The invention relates to an optical waveguide for a magnetooptical current sensor and a magnetooptical current sensor having such an optical waveguide.

BACKGROUND OF INVENTION

A magnetooptical current sensor having an optical waveguide is understood here as an optical measuring device for measuring an electrical current in a current conductor, in which light is guided through the optical waveguide and is changed in its optical properties in the optical waveguide by a magnetic field generated by the current. For example, a magnetooptical current sensor is based on the magnetooptical Faraday effect. The Faraday effect is understood as the rotation of the polarization direction of a linearly polarized electromagnetic wave in a medium by a magnetic field in parallel to the propagation direction of the wave. The rotation of the polarization direction is proportional in this case to the magnetic flux density of the magnetic field.

In a magnetooptical current sensor based on the Faraday effect, linearly polarized light is conducted through an optical waveguide arranged in the vicinity of the current conductor, which displays the Faraday effect. The magnetic field generated by the current in the current conductor causes a rotation of the polarization direction of the light in the optical waveguide. Since the magnetic flux density of the magnetic field in the optical waveguide is dependent on the amperage of the current in the current conductor, the amperage may be measured in that the rotation of the polarization direction of the light in the optical waveguide is detected. To detect the rotation of the polarization direction, the light output by the optical waveguide is guided, for example, through an output-side polarizer and a light intensity of the light transmitted by the polarizer is detected.

The light intensity of the light which is coupled into the optical waveguide of a magnetooptical current sensor is limited due to optical properties of the optical waveguide and/or the light source used, however. Furthermore, the light intensity of the light which is output by the optical waveguide is reduced in comparison to the light intensity of the light coupled into the optical waveguide by scattering, absorption, and reflection of light. The light intensity of the light output by the optical waveguide is determined, for example, using a photodiode. Photodiodes have a base noise, which is composed of greatly varying noise sources. A very low light intensity output by the optical waveguide results in a low signal-to-noise ratio of the measurement signal and therefore limits the accuracy of the measurement of the light intensity.

An increase of the light intensity of the light coupled into the optical waveguide by using a brighter light source is often not possible or not advantageous for various reasons. For example, the light intensity can be increased by using a suitable semiconductor laser as a light source. However, the vibration sensitivity of the magnetooptical current sensor increases strongly here due to the increased coherence length of the light. Limits are also placed on an improvement of the signal-to-noise ratio of the measurement signal by corresponding filtering of the measurement signal, which reduces the bandwidth of the resulting measurement signal, since the reduction of the bandwidth reduces the time resolution of the measurement signal.

SUMMARY OF INVENTION

The invention is based on the object of increasing the light intensity of the light output by an optical waveguide of a magnetooptical current sensor.

The object is achieved according to the invention by an optical waveguide and a magnetooptical current sensor having the features of the claims.

Advantageous embodiments of the invention are the subject matter of the dependent claims.

An optical waveguide according to the invention for a magnetooptical current sensor comprises a first end face, through which light can be coupled into the optical waveguide, and a second end face, through which light can be decoupled from the optical waveguide, wherein at least one of the two end faces has an antireflective coating.

The reflection of light at one end face of the optical waveguide according to the invention is reduced by an antireflective coating and the transmission of light through the end face is thus increased. If the end face, through which light is coupled into the optical waveguide, is provided with an antireflective coating, the light intensity of the light coupled into the optical waveguide can be increased by approximately 10 to 20% in relation to an embodiment of the optical waveguide without this antireflective coating. If the end face, through which light is decoupled from the optical waveguide, is provided with an antireflective coating, the light intensity of the light decoupled from the optical waveguide can be increased by approximately 10 to 20% in relation to an embodiment of the optical waveguide without this antireflective coating. Furthermore, an antireflective coating of the end face through which light is decoupled from the optical waveguide also advantageously reduces reflections of light at this end face, which reflect light back into the optical waveguide.

One embodiment of the optical waveguide according to the invention has at least one antireflective layer, which is arranged between two optical waveguide sections having indices of refraction different from one another. At a boundary layer between two optical waveguide sections having indices of refraction different from one another, a part of the light which is incident on the boundary layer is reflected. The transmission of light through the boundary layer and the light intensity of the light output by the optical waveguide are thus reduced. In addition, light is reflected back in the optical waveguide in the direction opposite to a provided passage direction. The antireflective layer between the two optical waveguide sections advantageously reduces the reflections of light between the optical waveguide sections and thus increases the light intensity of the light output by the optical waveguide in relation to an embodiment of the optical waveguide without the antireflective layer.

In a further embodiment of the optical waveguide according to the invention, the optical waveguide is manufactured at least in sections from glass, for example from optical flint glass. If the optical waveguide has optical waveguide sections which are manufactured from different glasses having indices of refraction different from one another, according to the above-mentioned embodiment of the optical waveguide according to the invention, an antireflective layer is preferably arranged between two adjacent such optical waveguide sections. Alternatively or additionally, an adhesive layer can be arranged between two such optical waveguide sections, by which the two optical waveguide sections are adhesively bonded to one another, wherein the adhesive layer has an index of refraction which is between the indices of refraction of the two optical waveguide sections. The manufacturing of the optical waveguide from glass has the advantage over the use of fiber-optic optical waveguides, for example, that costly optical fibers do not have to be used as the optical waveguide, which maintain a linear polarization of the light. An adhesive layer between two optical waveguide sections made of glasses having indices of refraction different from one another also advantageously reduces reflections at a boundary layer between the optical waveguide sections if the adhesive layer has an index of refraction which is between the indices of refraction of the two optical waveguide sections.

In a further embodiment of the optical waveguide according to the invention, the optical waveguide is designed at least in sections as a fiber-optic optical waveguide. If the optical waveguide has optical waveguide sections which are designed as fiber-optic optical waveguides different from one another having indices of refraction different from one another, according to the above-mentioned embodiment of the optical waveguide according to the invention, an antireflective layer is preferably arranged between two adjacent such optical waveguide sections. An end face which has an antireflective coating is in the case of an optical waveguide formed by one or more fiber-optic optical waveguides, for example, an end face of a fiber-optic optical waveguide or an end face of a ferrule of a fiber-optic optical waveguide.

A magnetooptical current sensor according to the invention for detecting an amperage of an electrical current in a current conductor comprises at least one optical waveguide according to the invention arranged in the area of the current conductor.

The advantages of a magnetooptical current sensor according to the invention correspond to the above-mentioned advantages of an optical waveguide according to the invention.

In one embodiment of the magnetooptical current sensor according to the invention, at least one optical waveguide extends in a ring shape around the current conductor. The measurement of the amperage of the current in the current conductor is thus substantially independent of the position of the current conductor in relation to the optical waveguide and the influence of external fields on the measurement is reduced.

BRIEF DESCRIPTION OF THE DRAWINGS

The above-described properties, features, and advantages of this invention and the manner in which they are achieved will be more clearly and unambiguously comprehensible in conjunction with the following description of exemplary embodiments, which are explained in more detail in conjunction with the drawings. In the drawings:

FIG. 1 shows a first exemplary embodiment of a magnetooptical current sensor,

FIG. 2 shows a detail of an optical waveguide having two optical waveguide sections and an adhesive layer.

DETAILED DESCRIPTION OF INVENTION

Figure 3:
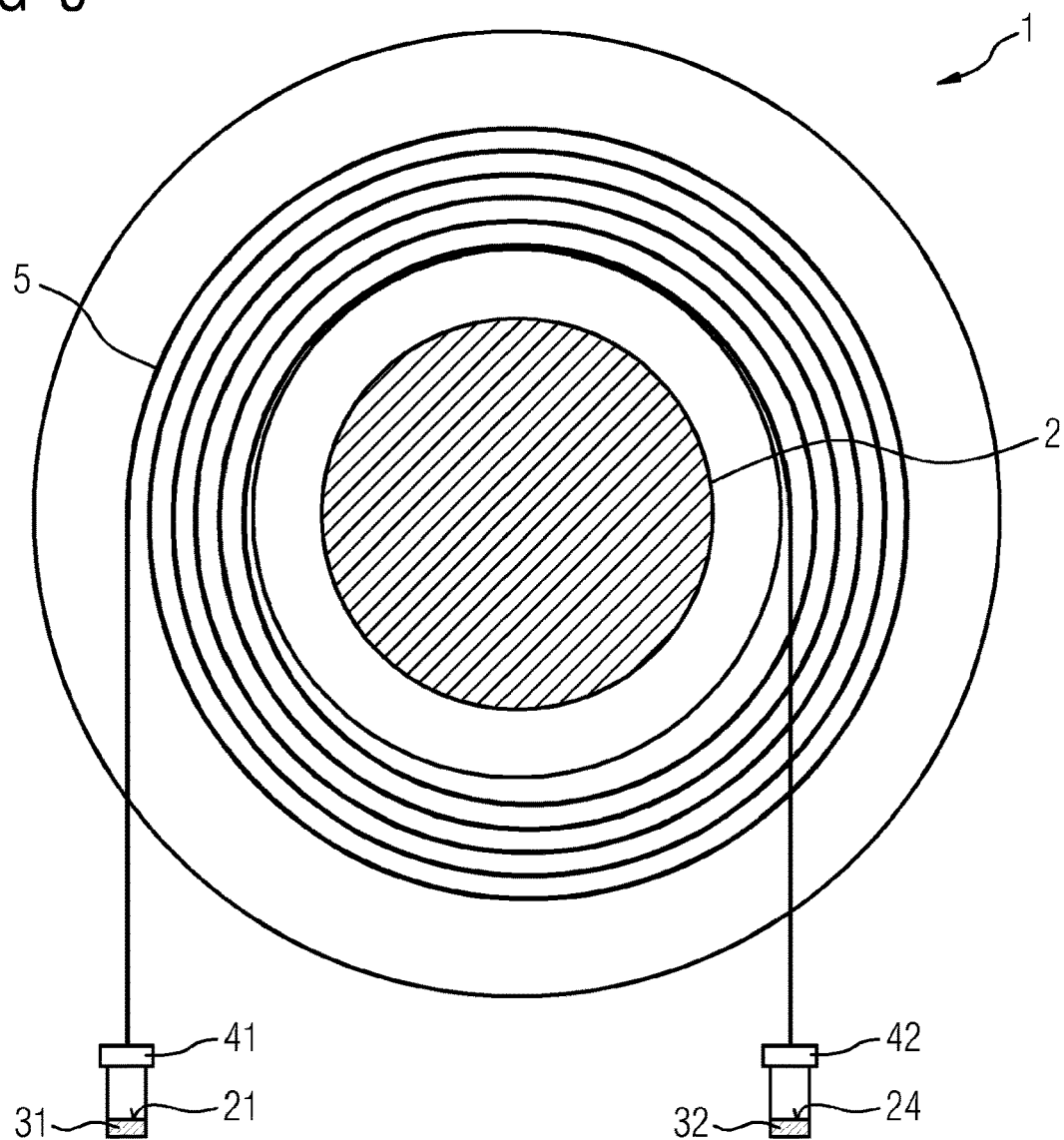
FIG. 3 shows a second exemplary embodiment of a magnetooptical current sensor.

Parts corresponding to one another are provided with the same reference signs in the figures.

FIG. 1 (FIG. 1) shows a first exemplary embodiment of a magnetooptical current sensor 1 for detecting an amperage of an electrical current in a current conductor 2. The current transducer 1 comprises a light coupling unit 3, a first exemplary embodiment of an optical waveguide 5, and a light decoupling unit 7.

The light coupling unit 3 has an input collimator 9 and a linear input polarizer 11. The input collimator 9 is configured to bundle light of a light source (not shown), for example of a light-emitting diode. The input polarizer 11 polarizes light so that linearly polarized light is supplied to the optical waveguide 5.

The optical waveguide 5 is configured to supply light supplied thereto from the light coupling unit 3 to the light decoupling unit 7. The optical waveguide 5 displays the Faraday effect. When a current flows in the current conductor 2, the polarization direction of the light is rotated during the passage of the optical waveguide 5 due to the Faraday effect.

The light decoupling unit 7 has an output polarizer 13 and a linear output collimator 15. A fraction of the light output by the optical waveguide 5 is transmitted by the output polarizer 13 which is parallel to a polarization axis of the output polarizer 13. The output collimator 15 bundles the light transmitted by the output polarizer 13 and supplies it to a photodetector (not shown). The photodetector is configured to detect the light intensity of the light supplied thereto. For example, the photodetector is designed as a photodiode. The amperage of the electrical current through the current conductor 2 is determined on the basis of the light intensity detected by the photodetector.

The optical waveguide 5 of this exemplary embodiment is designed as a glass ring which extends in a ring shape around the current conductor 2. The current conductor 2 extends orthogonally to the plane of the drawing of FIG. 1. The optical waveguide 5 is formed by four optical waveguide sections 17 to 20, which are each formed as a prismatoid from glass. A first optical waveguide section 17 extends from the light coupling unit 3 to a second optical waveguide section 18. The second optical waveguide section 18 extends between the first optical waveguide section 17 and a third optical waveguide section 19. The third optical waveguide section 19 extends between the second optical waveguide section 18 and the fourth optical waveguide section 20. The fourth optical waveguide section 20 extends from the third optical waveguide section 19 to the light decoupling unit 7. A longitudinal axis of the first optical waveguide section 17 is orthogonal to longitudinal axes of the second optical waveguide section 18 and the fourth optical waveguide section 20 and parallel to a longitudinal axis of the third optical waveguide section 19.

An end face 21, facing toward the light coupling unit 3, of the first optical waveguide section 17, which is orthogonal to the plane of the drawing of FIG. 1, has a first antireflective coating 31. An end face 22 of the first optical waveguide section 17 opposite to this end face 21 is tilted in relation to the plane of the drawing of FIG. 1 by 45° (see also FIG. 2 in this regard). Light which runs through the first optical waveguide section 17 along the longitudinal axis of the first optical waveguide section 17 is totally reflected toward the second optical waveguide section 18 at the end face 22. In the second optical waveguide section 18, the light is incident on an end face 23 (see FIG. 2) of the second optical waveguide section 18, which is also tilted by 45° in relation to the plane of the drawing of FIG. 1, and light is deflected by total reflection in parallel to the longitudinal axis of the second optical waveguide section 18. Accordingly, the light is guided from the second optical waveguide section 18 to the third optical waveguide section 19 and from the third optical waveguide section 19 to the fourth optical waveguide section 20. An end face 24, facing toward the light decoupling unit 7, of the fourth optical waveguide section 20, which is orthogonal to the plane of the drawing of FIG. 1, has a second antireflective coating 32.

The first antireflective coating 31 increases the light intensity of the light coupled into the optical waveguide 5 by approximately 10 to 20% in relation to an embodiment of the optical waveguide 5 without the first antireflective coating 31. The second antireflective coating 32 increases the light intensity of the light decoupled from the optical waveguide 5 by approximately 10 to 20% in relation to an embodiment of the optical waveguide 5 without the second antireflective coating 32. Furthermore, the second antireflective coating 32 reduces reflections of light at the end face 24 which reflect light back into the optical waveguide 5.

FIG. 2 (FIG. 2) shows an optical waveguide 5 embodied similarly to FIG. 1 in an area in which the first optical waveguide section 17 borders the second optical waveguide section 18. In this example, the first optical waveguide section 17 and the second optical waveguide section 18 are manufactured from glasses different from one another, which have indices of refraction different from one another. The first optical waveguide section 17 and the second optical waveguide section 18 are adhesively bonded to one another by an adhesive layer 33, which has an index of refraction which is between the indices of refraction of the two optical waveguide sections 17, 18. Reflections of light during the passage from the first optical waveguide section 17 into the second optical waveguide section 18 are thus advantageously reduced in relation to an embodiment of the optical waveguide 5 without the adhesive layer 33.

FIG. 3 (FIG. 3) shows a second exemplary embodiment of a magnetooptical current sensor 1 for detecting an amperage of an electrical current in a current conductor 2. This exemplary embodiment has an optical waveguide 5, which is designed as a fiber-optic optical waveguide and extends with a plurality of turns in a ring shape around the current conductor 2. The ends of the optical waveguide 5 each have a ferrule 41, 42. Each ferrule 41, 42 has an end face 21, 24 having an antireflective coating 31, 32.

Figure 4:
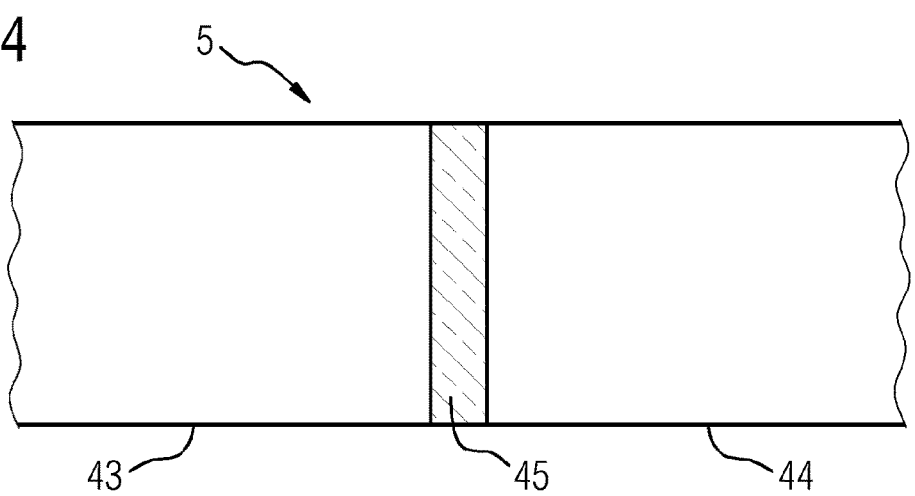
FIG. 4 shows a detail of an optical waveguide having two optical waveguide sections and an antireflective layer.

FIG. 4 (FIG. 4) shows a detail of an optical waveguide 5 for a magnetooptical current sensor 1, which has optical waveguide sections 43, 44 having indices of refraction different from one another. For example, the optical waveguide sections 43, 44 are manufactured from different glasses from one another or are formed by fiber-optic optical waveguides different from one another. An antireflective layer 45 is arranged between two adjoining optical waveguide sections 43, 44, which reduces reflections of light during the passage of light between the optical waveguide sections 43, 44 in relation to an embodiment of the optical waveguide 5 without the antireflective layer 45.

Although the invention was illustrated and described in more detail by preferred exemplary embodiments, the invention is not thus restricted by the disclosed examples and other variations can be derived therefrom by a person skilled in the art without leaving the scope of protection of the invention.

The invention claimed is:

1. A magnetooptical current sensor for detecting an amperage of an electrical current in a current conductor, the current sensor comprising:
   at least one optical waveguide adapted to be arranged in an area of the current conductor, the optical waveguide comprising:
      a first end face, through which light can be coupled into the optical waveguide, and
      a second end face, through which light can be decoupled from the optical waveguide,
      wherein at least one of the first or second end faces has an antireflective coating and is an end face of a ferrule of a fiber-optic optical waveguide,
      wherein the optical waveguide is designed at least in sections as a fiber-optic optical waveguide.

2. The magnetooptical current sensor of claim 1, the optical waveguide further comprising:
   at least one antireflective layer, which is arranged between two optical waveguide sections having indices of refraction different from one another.

3. The magnetooptical current sensor of claim 1, wherein the optical waveguide is manufactured at least in sections from glass.

4. The magnetooptical current sensor of claim 3, wherein at least one antireflective layer is arranged between two optical waveguide sections, which are manufactured from glasses different from one another having indices of refraction different from one another.

5. The magnetooptical current sensor of claim 3, wherein at least one adhesive layer, by which two optical waveguide sections manufactured from glasses different from one another and having indices of refraction different from one another are adhesively bonded to one another, wherein the adhesive layer has an index of refraction which is between the indices of refraction of the two optical waveguide sections.

6. The magnetooptical current sensor of claim 1, wherein at least one antireflective layer is arranged between two optical waveguide sections, which are designed as fiber-optic optical waveguides different from one another.

7. The magnetooptical current sensor of claim 1, wherein at least one end face, which has an antireflective coating, is an end face of a fiber-optic optical waveguide.

8. The magnetooptical current sensor of claim 1, wherein the optical waveguide extends in a ring shape around the current conductor.

9. A magnetooptical current sensor system comprising:
   a current conductor;
   a current sensor configured to detect an amperage of an electrical current in the current conductor; and
   an optical waveguide arranged in an area of the current conductor, the optical waveguide comprising:
      a first end face, through which light can be coupled into the optical waveguide, and
      a second end face, through which light can be decoupled from the optical waveguide,
      wherein at least one of the first or second end faces has an antireflective coating and is an end face of a ferrule of a fiber-optic optical waveguide,
      wherein the optical waveguide is designed at least in sections as a fiber-optic optical waveguide.

10. The magnetooptical current sensor of claim 9, the optical waveguide further comprising:
at least one antireflective layer, which is arranged between two optical waveguide sections having indices of refraction different from one another.

11. The magnetooptical current sensor of claim 9, wherein the optical waveguide is manufactured at least in sections from glass.

12. The magnetooptical current sensor of claim 11, wherein at least one antireflective layer is arranged between two optical waveguide sections, which are manufactured from glasses different from one another having indices of refraction different from one another.

13. The magnetooptical current sensor of claim 11, wherein at least one adhesive layer, by which two optical waveguide sections manufactured from glasses different from one another and having indices of refraction different from one another are adhesively bonded to one another, wherein the adhesive layer has an index of refraction which is between the indices of refraction of the two optical waveguide sections.

14. The magnetooptical current sensor of claim 9, wherein at least one antireflective layer is arranged between two optical waveguide sections, which are designed as fiber-optic optical waveguides different from one another.

15. The magnetooptical current sensor of claim 9, wherein at least one end face, which has an antireflective coating, is an end face of a fiber-optic optical waveguide.

16. The magnetooptical current sensor of claim 9, wherein the optical waveguide extends in a ring shape around the current conductor.

* * * * *